United States Patent [19]

Higuchi et al.

[11] Patent Number: 5,314,573
[45] Date of Patent: May 24, 1994

[54] DRY ETCHING POLYSILICON USING A BROMINE-CONTAINING GAS

[75] Inventors: Fumihiko Higuchi, Yokohama; Yoshio Fukasawa, Kofu, both of Japan

[73] Assignee: Tokyo Electron Limited, Tokyo, Japan

[21] Appl. No.: 885,855

[22] Filed: May 20, 1992

[30] Foreign Application Priority Data

May 20, 1991 [JP] Japan ................. 3-145660

[51] Int. Cl.$^5$ ............... H01L 21/306; B44C 1/22
[52] U.S. Cl. ..................... 156/643; 156/646; 156/657; 156/662
[58] Field of Search ............... 156/643, 662, 646, 657

[56] References Cited

U.S. PATENT DOCUMENTS

| | | | |
|---|---|---|---|
| 4,450,042 | 5/1984 | Purdes | 156/643 |
| 4,490,209 | 12/1984 | Hartman | 156/643 |
| 4,502,915 | 3/1985 | Carter et al. | 156/643 |
| 4,799,991 | 1/1989 | Dockrey | 156/643 |
| 4,855,017 | 8/1989 | Douglas | 156/643 |
| 4,971,653 | 11/1990 | Powell et al. | 156/345 |
| 5,007,982 | 4/1991 | Tsou | 156/643 |

FOREIGN PATENT DOCUMENTS 0474244 3/1992 European Pat. Off. .

OTHER PUBLICATIONS

R. A. Morgan, *Plasma Etching in Semiconductor Fabrication*, Elsevier, New York, 1985, pp. 75–80.
VLSI Technology, 1981, Chapter 8, pp. 303–345, C. J. Mogab, "Dry Etching", S. M. Sze, ed.

*Primary Examiner*—Brian E. Hearn
*Assistant Examiner*—Laura Holtzman
*Attorney, Agent, or Firm*—Oblon, Spivak, McClelland, Maier & Neustadt

[57] ABSTRACT

The present invention provides a dry etching method for achieving a satisfactory anisotropic etching of, for example, a semiconductor wafer, particularly, a polysilicon layer formed on the wafer. In the present invention, a mixed gas comprising a first gas containing Br and a second gas containing a halogen element other than Br, e.g., a mixed gas consisting of a HBr gas and a HCl gas, is introduced into a vacuum chamber. The mixed gas is converted into plasma by applying a high frequency power to an upper electrode 5. The plasma region is irradiated, as desired, with an ultraviolet light. The semiconductor wafer is etched with the plasma. The etching is carried out under optimum conditions. For example, the surface temperature of the semiconductor wafer, i.e., workpiece, is maintained at a level falling within a range of between 70° C. and 120° C. Also, the flow rate ratio of the mixed gas is suitably controlled.

10 Claims, 7 Drawing Sheets

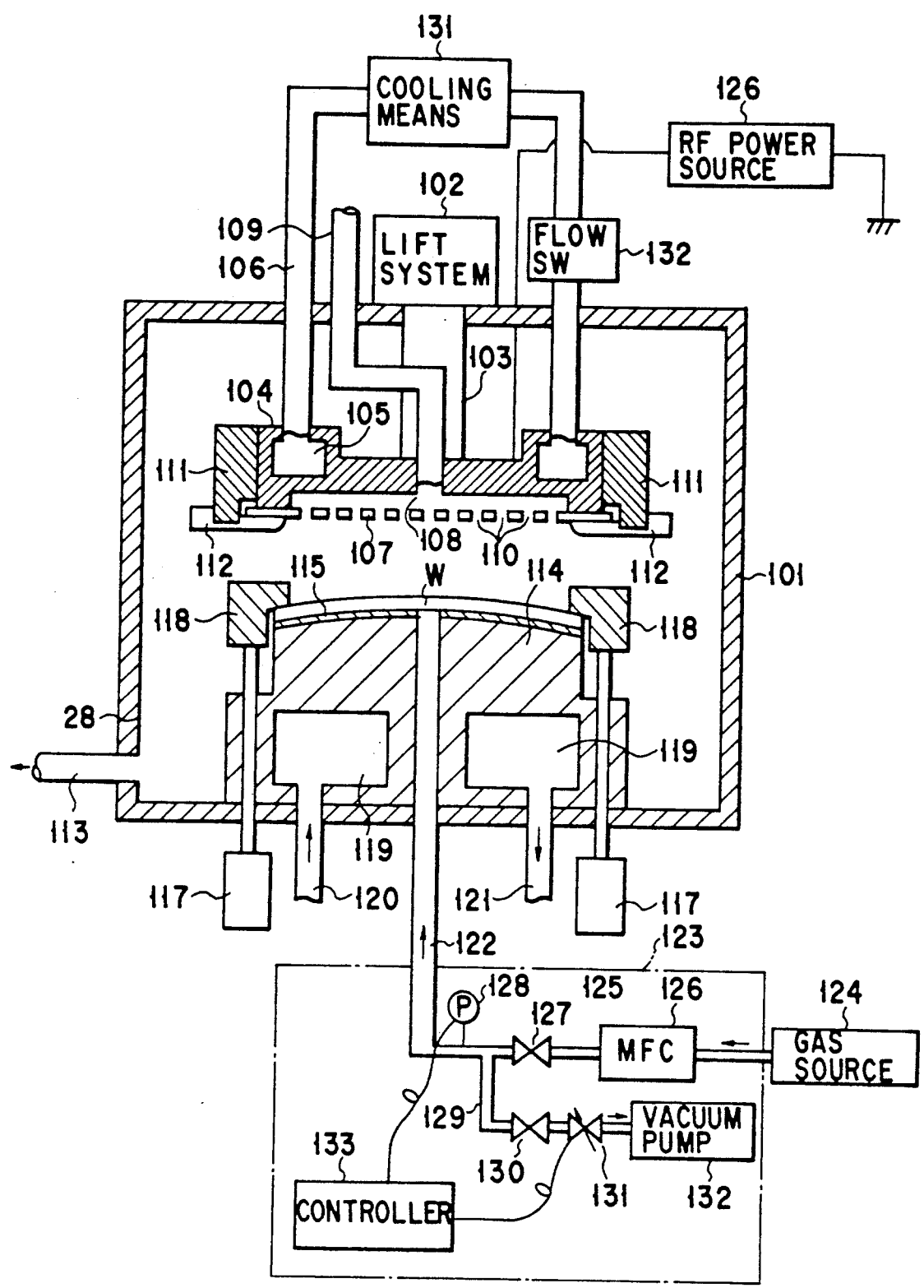
F I G. 6

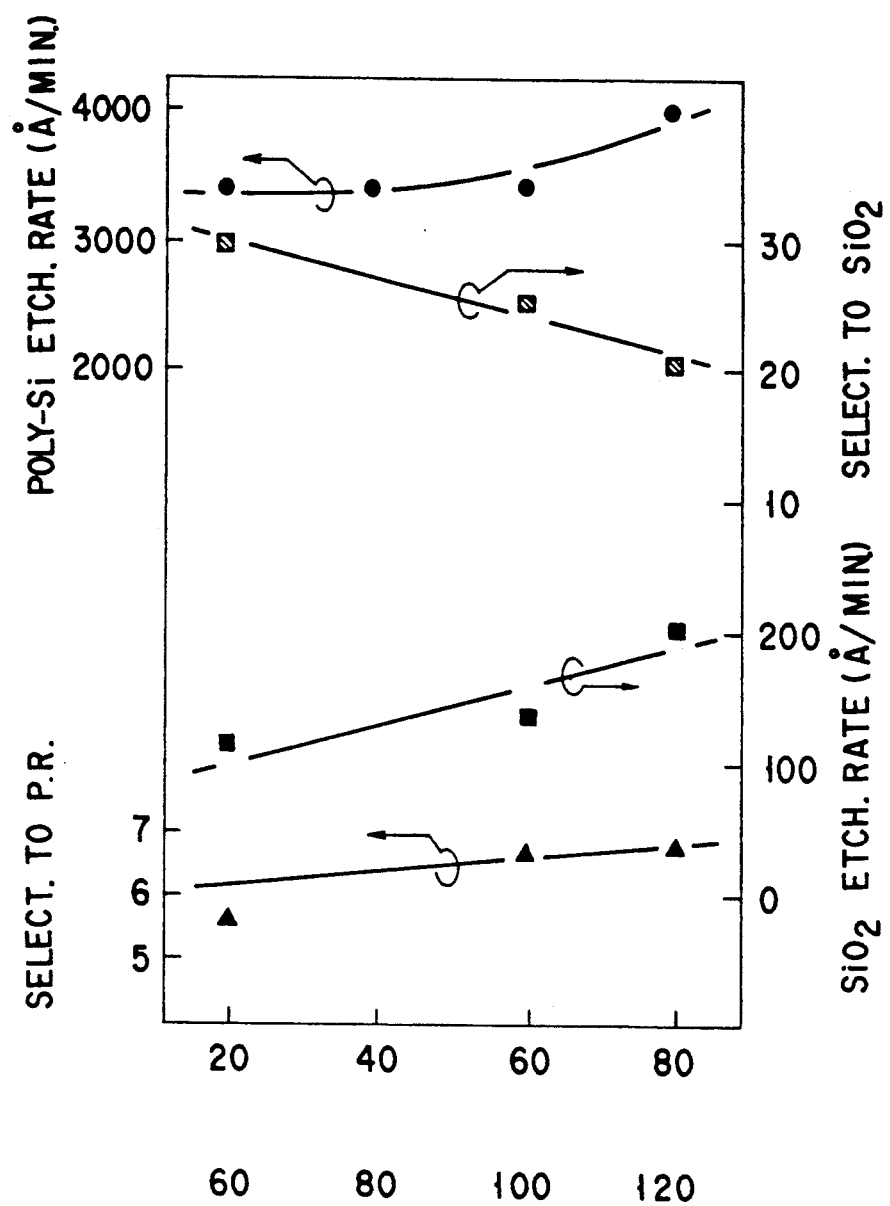
F I G. 8

DRY ETCHING POLYSILICON USING A BROMINE-CONTAINING GAS

BACKGROUND OF THE INVENTION

1. Field of the Invention

The present invention relates to a dry etching method for applying an etching treatment to a silicon semiconductor wafer.

2. Description of the Related Art

A dry etching treatment is applied to a silicon semiconductor wafer in the manufacture of a semiconductor device. For example, the dry etching treatment is employed for the separation of a capacitor or an element and for forming a contact hole. It is necessary to satisfy various requirements in the etching treatment. For example, the etching should be carried out with a large etching selectivity relative to a resist film or an undercoat film. It is also necessary for the side wall of a groove to be etched smoothly to provide a wall surface substantially perpendicular to the wafer surface. In other words, a high etching anisotropy should be satisfied. Further, the etching should be carried out with a high etching rate. Still further, it is important to diminish the etching residue.

It was customary to use, for example, a $CCl_4$ gas in the dry etching treatment. In this case, an electric field is applied to the $CCl_4$ gas so as to form a plasma. A film is removed by Cl contained in the plasma. On the other hand, carbon contained the plasma serves to form a protective film together with the organic component contained in a resist film and silicon so as to ensure an etching anisotropy. Further, the gas flow rate and power for applying an electric field to the gaseous atmosphere are suitably controlled so as to obtain conditions for achieving a high etching rate and etching selectivity.

In the conventional method, however, both a side wall-protecting function and a film-removing function are produced within a gas of a single kind so as to obtain an etching anisotropy. In this case, it is difficult to find optimum conditions under which these two different functions are produced satisfactorily. For example, if it is intended to intensify the side wall-protecting function, polymer is partly deposited on an unexpected portion as a residue.

What should also be noted is that the intensity of each of these functions is also changed by other conditions such as the power value, i.e., energy of plasma, with the result that it is very difficult to find optimum conditions which simultaneously permit a high etching rate, a satisfactory etching anisotropy, and a high etching selectivity.

For example, a high etching rate can be obtained by increasing the energy of the plasma. In this case, however, a sputtering function is produced unduly strongly, making it impossible to ensure a suitable etching selectivity relative to the undercoat layer. Thus, overetching is brought about. By the contrary, the etching selectivity can be improved by diminishing the energy of the plasma. In this case, however, the etching rate is lowered. Also, if an oxide region is included in the surface of the film to be etched, the film-removing function is weakened, with the result that the oxide region is left unremoved as a columnar residue.

A measure for overcoming the difficulty noted above is proposed in, for example, U.S. Pat. No. 4,490,209. It is taught that a mixed gas prepared by mixing HBr and a chlorine-containing gas, e.g., HCl, at a predetermined ratio is used at a predetermined flow rate for etching a silicon layer. However, this U.S. Patent does not teach at all the criticalities of the other etching conditions.

SUMMARY OF THE INVENTION

The present invention has been achieved in view of the situation described above and is intended to provide a dry etching method which permits a satisfactory anisotropic etching while ensuring a high etching selectivity and a high etching rate.

According to the present invention, there is provided a dry etching method, comprising the steps of:

disposing a workpiece having an exposed polysilicon layer on a lower electrode disposed to face an upper electrode within an etching apparatus; and supplying a mixed gas consisting of a first gas which contains bromine and a second gas which contains a halogen gas other than bromine over the workpiece, while applying a high frequency power to said upper electrode so as to produce a plasma which serves to etch the exposed polysilicon layer.

In the dry etching method of the present invention, it is desirable to apply the etching treatment while the surface temperature of the workpiece, e.g., semiconductor wafer, is maintained at a level falling within a range of between 70° C. and 120° C.

In the case of using a dry etching apparatus in which the workpiece is fixed to the lower electrode by a mechanical clamping means, it is desirable to keep the temperature of the lower electrode at a level falling within a range of between 20° C. and 60° C. in order to permit the surface temperature of the workpiece to fall within a range of between 70° C. and 120° C. It should be noted in this connection that it is difficult to set the surface temperature of the workpiece at a level equal to the temperature of the lower electrode (susceptor) in view of the contact state between the workpiece and the lower electrode. In general, the surface temperature of the workpiece is set higher by 50° to 60° C. than the temperature of the lower electrode Further, in the case of using a dry etching apparatus in which the workpiece is fixed to the lower electrode by utilizing an electrostatic chuck means, it is desirable to set the temperature of the lower electrode to fall within a range of between 60° C. and 100° C. in order to enable the surface temperature of the workpiece to fall within the range of between 70° C. and 120° C. It is necessary to set the temperature of the lower electrode at a level lower than the surface temperature of the workpiece in this case, too, in view of the contact state between the workpiece and the lower electrode (susceptor) supporting the workpiece. Specifically, a temperature difference of about 10° C. to 20° C. is provided between the two in this case.

Suppose the workpiece is in the form of a disk having a diameter of 150 mm, and the lower electrode is also in the form of a disk having a diameter of 150 mm to 220 mm (i.e. 1 to 1.47 times as large as the workpiece). In this case, it is desirable to set the clearance between the upper and lower electrodes at 0.6 mm to 0.8 mm during the etching treatment.

The first gas used in the present invention is selected from the group consisting of a $Br_2$ gas and a HBr gas. On the other hand, the second gas used in the present invention is selected from the group consisting of a chlorine-containing gas such as HCl gas and $Cl_2$ gas and a fluorine-containing gas such as CF$_4$, C$_2$F$_4$ and CHF$_3$. Where a HBr gas is used as the first gas and a HCl gas or a Cl$_2$ gas is used as the second gas, it is desirable to set the ratio of the flow rates, i.e., HBr/[HBr+(HCl or Cl$_2$)], at 5 to 50%.

It is desirable to perform a high frequency application with a frequency of 13.56 MHz and an RF power per unit area of the workpiece of 0.85 to 1.41 W/cm$^2$.

In order to enable the surface temperature of the workpiece to be kept at a level falling within a range of between 70° C. and 120° C., it is possible to permit a cooling gas to flow through the interface between the workpiece and the lower electrode.

Further, it is desirable in the present invention to irradiate a plasma discharge region converted from the mixed gas with an ultraviolet light so as to facilitate the etching treatment.

As described above, the present invention makes it possible to carry out an optimum etching treatment by controlling the various etching conditions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a cross sectional view showing an etching apparatus in which a workpiece (semiconductor wafer) is fixed to a lower electrode by a mechanical clamping means;

FIG. 8 is a graph showing the relationship among the temperature of the lower electrode, the etching rate, the etching selectivity, and the etched shape;

DETAILED DESCRIPTION OF THE PREFERRED EMBODIMENTS

Figure 1:
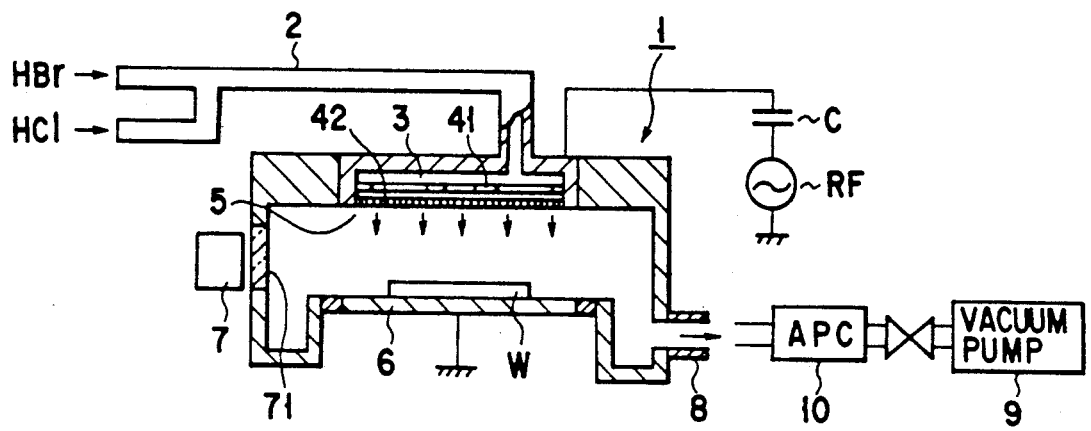
FIG. 1 is a cross sectional view exemplifying an apparatus used for working the method of the present invention.

FIG. 1 exemplifies an apparatus used for performing an etching treatment by a method according to one embodiment of the present invention. As shown in the drawing, the etching apparatus comprises a vacuum chamber 1. A gas inlet pipe 2 for supplying a treating gas is connected to the vacuum chamber 1. Also, a gas inlet chamber 3 for uniformly introducing the treating gas into the vacuum chamber 1 is formed at an outlet port region of the gas inlet pipe 2.

Figure 2A:
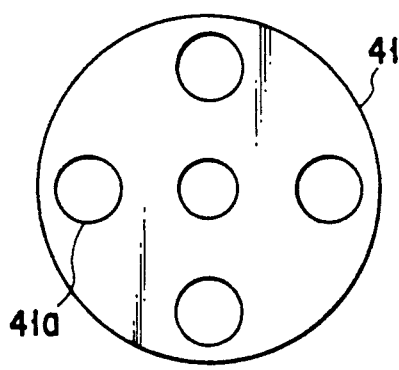
FIGS. 2A and 2B are plan views each exemplifying a gas diffusion plate used in the apparatus shown in FIG. 1.
Figure 2B:
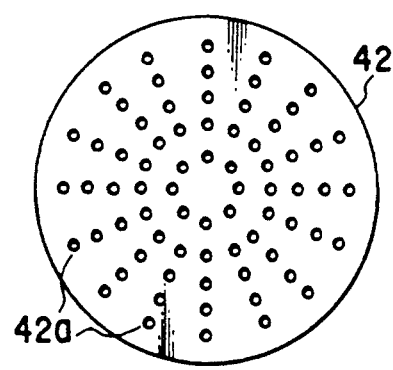

First and second gas diffusion plates 41 and 42 each formed of, for example, anodized aluminum are disposed slightly apart from each other between the gas inlet chamber 3 and the vacuum chamber 1. In the embodiment shown in the drawing, the first gas diffusion plate 41 is disposed above the second gas diffusion plate 42. As shown in FIG. 2A, the first gas diffusion plate 41 on the side of the former stage is provided with holes 41a each having a diameter of, for example, 3 to 5 cm. These holes 41a are formed in the central portion and four peripheral portions of the plate 41. On the other hand, FIG. 2B shows that the second gas diffusion plate 42 on the side of the latter stage is provided with small holes 42a each having a diameter of, for example, 0.5 to 1 mm. These small holes 42a are radially arranged, as seen from FIG. 2B. It should be noted that these gas diffusion plates 41, 42 and the members surrounding these gas diffusion plates collectively form an upper electrode 5 in the embodiment shown in the drawing.

A lower electrode 6 which also acts as a supporting member of a semiconductor wafer W is disposed below the upper electrode 5 in a manner to face the upper electrode 5. The upper electrode 5 is connected via a capacitor C to a high frequency power source RF. On the other hand, the lower electrode 6 is connected to the ground. I$^t$ should be noted that a passageway (not shown) of a cooling fluid is formed inside the lower electrode 6 so as to cool the semiconductor wafer W and, thus, to permit the surface temperature of the wafer W to be kept at a level falling within a range of between 70° C. and 130° C.

Further, an ultraviolet light lamp 7 is disposed outside the vacuum chamber 1 to face a window portion 71 formed in the side wall of the vacuum chamber 1. A plasma discharge region formed within the vacuum chamber 1 is irradiated with an ultraviolet light emitted from the lamp 7. It is possible to generate a plasma with a low power energy by utilizing the energy of the ultraviolet light so as to suppress the sputtering damage done by the active species to the semiconductor wafer. The dry etching apparatus shown in FIG. 1 also comprises a gas discharge pipe 8, a vacuum pump 9 connected to the gas discharge pipe 8, and an automatic pressure controller (APC) to provided between the gas discharge pipe 8 and the vacuum pump 9.

A semiconductor wafer W having a diameter of 15 cm was actually subjected to a dry etching treatment using the etching apparatus of the construction described above. The semiconductor wafer W used in this test included a silicon substrate, a silicon dioxide film formed on the silicon substrate in a thickness of 200 Å, a polysilicon film formed on the silicon dioxide film in a thickness of 4,000 Å, and a resist film formed on the polysilicon film in a thickness of 10,000 Å. To be more specific, the semiconductor wafer W of the particular construction was disposed on the lower electrode 6.

The gap between the upper electrode 5 and the lower electrode 6 was set at 7 mm. Under this condition, a first gas of a HBr gas and a second gas of a HCl gas were introduced at flow rates of 30 sccm and 200 sccm, respectively, into the vacuum chamber 1 through the gas inlet pipe 2 and the gas diffusion plates 41 and 42. Also, the gas within the vacuum chamber 1 was discharged through the discharge pipe 8 by operating the vacuum pump 9. In this step, the gas pressure within the vacuum chamber 1 was set at 600 mTorr by the APC 10.

Under the conditions described above, a high frequency power of 200 W at a frequency of 13.56 MHz was applied to a reacting region between the upper electrode 5 and the lower electrode 6, and an ultraviolet light emitted from the ultraviolet light lamp 7 was applied to the reacting region so as to generate plasma. Under this condition, the polysilicon film in the semiconductor wafer W was etched. The surface temperature of the semiconductor wafer W ws found to be about 100° C. On the other hand, the temperatures of the upper electrode 5 and the lower electrode 6 were found to be 40° C. and 60° C., respectively. Incidentally, the surface temperature of the semiconductor wafer w was measured by using a thermolabel.

In the etching treatment described above, the etching rate of the polysilicon film was found to be 3549 A/min. The etching selectivity of the poysilicon film to the silicon dioxide film, i.e., the ratio of the polysilicon etching rate to the silicon dioxide etching rate, was found to be 20.0. Further, the etching selectivity of the polysilicon film to the resist film, i.e., the ratio of the polysilicon etching rate to the resist etching rate, was found to be 6.5.

Figure 3:
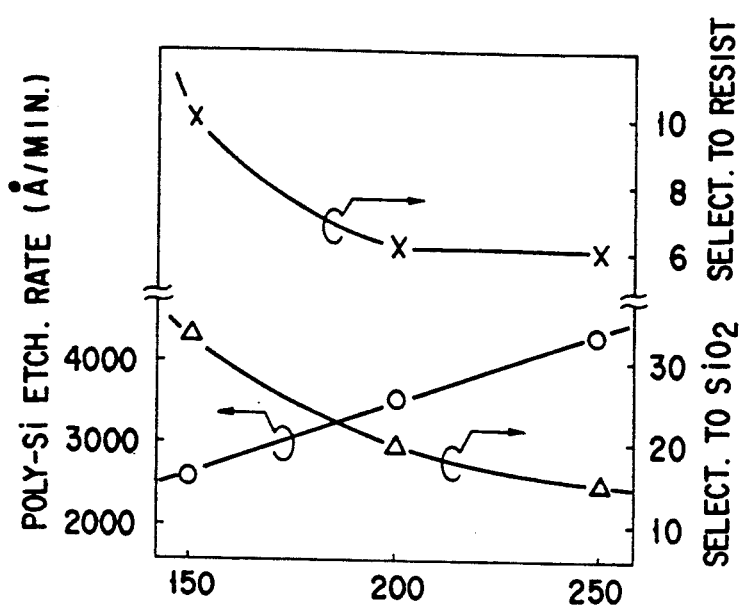
FIG. 3 is a graph showing the relationship among the power of a power source, the etching rate, and the etching selectivity.

Additional etching tests were conducted to measure etching rates and etching selectivities under the same conditions as above, except that the high frequency power was set at 150 W or 250 w. FIG. 3 shows the results of the tests together with the results of the test described previously. In FIG. 3, marks "○" denote the polysilicon etching rate, marks "Δ" indicate the etching selectivity of the polysilicon film to the silicon dioxide film, and marks "x" represent the etching selectivities of the polysilicon film to the resist film.

After completion of the etching test, the surface of the semiconductor wafer was observed with an SEM photo. The polysilicon film was found to have been cut way substantially at right angles. Specifically, an over-etching of the undercoat film was not found at all, and the polysilicon film was found to have been cut away substantially vertically relative to the undercoat film. Further, a residue deposition on the corner portion was scarcely found.

As apparent from the etching tests described above, the dry etching method of the present invention permits such a high etching rate as about 2400 Å/min to about 4300 Å/min and also permits such a high etching selectivity of polysilicon to silicon dioxide as about 16 to 35. In addition an over-etching of the undercoat film can be prevented so as to achieve a satisfactory etching with a high etching anisotropy. Further, the dry etching method of the present invention permits a high etching selectivity of polysilicon to a resist film.

Figure 4:
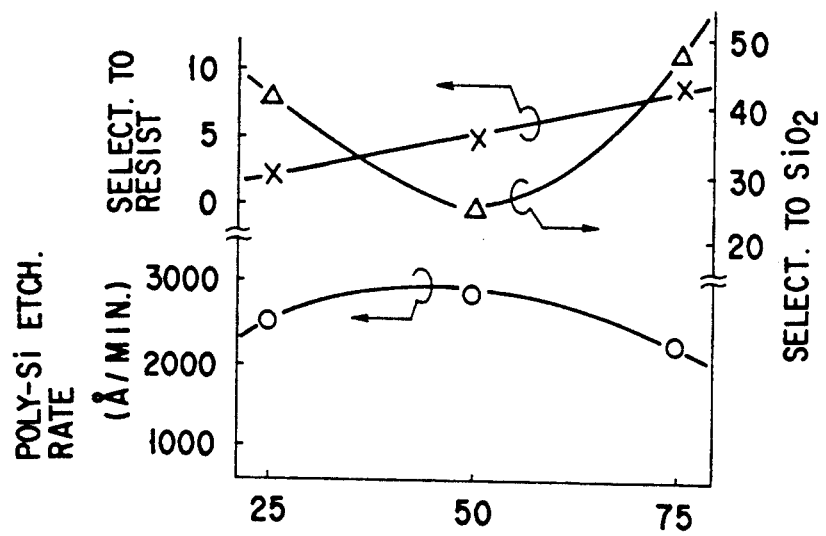
FIG. 4 is a graph showing the relationship among the flow rate ratio of HBr, the etching rate, and the etching selectivity.

An additional experiment was conducted by using the apparatus shown in FIG. 1. In this experiment, a chlorine gas ($Cl_2$) was used as the second gas in place of the HCl gas used in the experiment described previously. Also, the flow rate ratio of the HBr gas to the sum of the HBr gas and the $Cl_2$ gas set at 25%, 50% or 75%. In other words, the flow rate ratio of the chlorine gas was set at 75%, 50%, or 25%, respectively. Further, the high frequency power was set at 175 W. The other conditions were exactly the same as in the experiment described previously. Further, the etching treatment was applied to a semiconductor wafer W equal to that used in the experiment previously. FIG. 4 shows the results of the test with respect to the etching rates and the etching selectivities. In FIG. 4, marks "○" denote the polysilicon etching rate, marks "Δ" indicate the etching selectivity of the polysilicon film to the silicon dioxide film, and marks "x" represent the etching selectivities of the polysilicon film to the resist film.

As apparent from the results shown in FIG. 4, the method of the present invention permits such a high etching selectivity of polysilicon to silicon dioxide as about 25 to 50 and also permits such a high etching rate of polysilicon as 2,000 to 3,000 Å/min, in the case of using a mixed gas consisting of a HBr gas and a chlorine gas ($Cl_2$). Further, the method of the present invention also permits a high etching selectivity of polysilicon to a resist film.

After completion of the additional etching test, the surface of the semiconductor wafer was observed with an SEM photo. In this case, however, a large number of residue columns 91a were formed on the undercoat film (silicon dioxide film) 91, as show in FIG. 5, where the HBr gas flow rate ratio was set at 75%, i.e., HBr 75/$Cl_2$ 25. Reference numerals 92 and 93 shown in FIG. 5 denote a polysilicon film and a resist film, respectively. On the other hand, a residue column was not recognized at all in the case where the HBr gas flow rate ratio was set at 25%, i.e., (HBr 25/$Cl_2$ 75). Further, a residue column formation was slightly recognized in the case where the HBr gas flow rate ratio was set at 50%, i.e., (HBr 50/$Cl_2$ 50).

Figure 5:
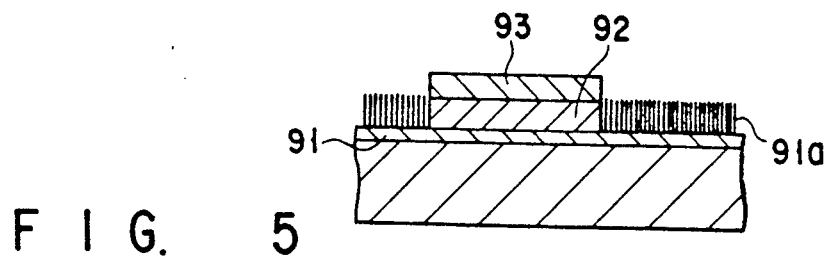
FIG. 5 is a cross sectional view showing the surface state of a semiconductor wafer after completion of the etching treatment

It is considered reasonable to interpret the results of the test described above as follows. First of all, the amount of residue is increased with increase in the HBr gas flow rate ratio. In this case, chlorine mainly serves to remove the polysilicon. On the other hand, bromine (Br) forms a polymer together with silicon and the organic component contained in the resist film. The polymer thus formed is considered to deposit on the side wall of the polysilicon film so as to form a protective film and, thus, to achieve an etching anisotropy. Where the HBr gas flow rate ratio is considerably increased, the polymer noted above is excessively formed, with the result that the polymer is deposited on the silicon dioxide film as well as on the side wall of the polysilicon film so as to form the residue columns as shown in FIG. 5.

The residue acts as an impurity so as to impair the characteristics of the semiconductor device. In order to suppress the residue formation, it is desirable to set the flow rate ratio of the HBr gas to the sum of the mixed gas (HBr+$Cl_2$) at 50% or less in the case where a mixed gas consisting of a HBr gas and a chlorine gas ($Cl_2$) is used for the etching treatment. However, if the flow rate ratio of the HBr gas is unduly low, the side wall rotecting function is lowered, with the result that a side etching proceeds in the side wall so as to form an undercut structure. It is desirable to set the flow rate ratio of the HBr gas to fall within a range of between 5% and 50%.

As described above, the side wall protecting function performed by bromine and the film removing function performed by chlorine collectively serve to encure an anisotropic etching. In ensuring the anisotropic etching in this fashion, it is important to determine the amount of bromine not to exceed a certain critical value relative to the chlorine amount so as to suppress the columnar residue formation. The critical value noted above is considered to be dependent on the kind of the gas which forms bromine and the kind of the gas which forms chlorine. In practice, it is necessary to experimentally determine in advance the HBr gas flow rate ratio at which a columnar residue is formed.

A dry etching was actually applied to the semiconductor wafer described previously by using a mixed gas consisting of a HBr gas and a $Cl_2$ gas. It was found possible to eliminate a columnar residue formation where at least the HBr gas flow rate fell within a range of between 10 and 50 sccm and the chlorine gas flow rate fell within a range of between 150 and 300 sccm, making it possible to achieve a satisfactory etching with the corner of the etched film held at right angles. Substantially the same results were obtained where a HBr gas was used together with a HCl gas in place of the $Cl_2$ gas used in the experiment described above.

The halogen element performing the film removing function in the present invention is not restricted to chlorine. It is also possible to use halogen elements other than chlorine and bromine, which is used for obtaining a side wall protecting function. For example, fluorine can be used in place of chlorine. Of course, various gases can be used as the second gas as far as such a halogen element other than Br is contained in the gas.

The first gas containing bromine, which performs the side wall protecting function, is not restricted to a HBr gas. Various gases such as bromine gas ($Br_2$) can be used in place of the HBr gas. In other word, the first gas may contain a compound comprising other halogen as long as it contains Br.

The film to be etched by the method of the present invention is not restricted to a polysilicon film. The method can also be employed for etching, for example, a polysilicon film doped with an impurity. Further, the material of the undercoat film is not restricted to silicon dioxide. For example, the undercoat film may be formed of a monocrystalline silicon.

Further, an additional gas other than those directly involved in the etching may also be introduced into the vacuum chamber in the present invention. For example, an inert gas such as a helium gas may be introduced into the vacuum chamber in order to stabilize the plasma formed within the vacuum chamber.

FIG. 6 shows an etching apparatus in which a workpiece (semiconductor wafer) W is fixed by a mechanical clamping means, and a gas acting as a heat transfer medium is introduced into the free space between the back surface of the semiconductor wafer W and the upper surface of a lower electrode supporting the wafer W. The drawing exemplifies the etching of a polysilicon film.

The apparatus shown in FIG. 6 comprises a reaction vessel 101 formed of an aluminum plate having the surface region subjected to an anodizing treatment. An electrode body 104 is disposed in the upper portion within the reaction vessel 101. The electrode body 104 is connected to a lift system 102, e.g., an air cylinder or a ball screw, with a connecting rod 103 interposed therebetween, with the result that the electrode body 104 is movable in the vertical direction. The electrode body 104 is formed of an aluminum body having the surface region subjected to an anodizing treatment, and is provided with a cooling means comprising a fluid passageway 105 circulating within the electrode body 104 and a cooling device 131 connected to the passageway 105 via a pipe 106. The cooling means is constructed to control, for example, the water temperature at a desired level for circulation through the reaction vessel.

An upper electrode 107 formed of, for example, amorphous carbon is disposed in contact with the lower surface of the electrode body 104, with the result that the electrode body 104 and the upper electrode 107 are electrically connected to each other. A small free space 108 is formed between the upper electrode 107 and the electrode body 104, and a gas supply pipe 109 is connected to the free space 108. A reaction gas housed in a gas supply source (not shown) disposed outside the reaction vessel 101 can be supplied into the free space 108 through the gas supply pipe 109. The upper electrode 107 is provided with a plurality of holes 110 for allowing the reaction gas supplied into the free space 108 to flow into the inner region of the reaction vessel 101 through the upper electrode 107.

An insulating ring 111 is formed to cover the circumferential outer surfaces of the upper electrode 107 and the electrode body 104. Further, a shield ring 112 is formed to extend from the lower surface of the insulating ring 111 to the lower peripheral portion of the upper electrode 107. The shield ring 112 is formed of an insulating material, e.g., tetrafluoroethylene resin, such that plasma can be generated in a region of a diameter substantially equal to that of the semiconductor wafer W which is to be subjected to an etching treatment. Further, a discharge system 113 for evacuating the inner region of the reaction vessel 101 to a predetermined degree of vacuum is provided in the lower portion of the reaction vessel 101. On the other hand, the upper electrode 107 is connected to an RF power source 126.

A flow switch 132 for detecting a poor cooling of the upper electrode is disposed midway of the pipe 106. The flow switch 132 serves to detect whether or not the flow rate of the cooling water flowing within the pipe 106 falls within a predetermined range. When the flow rate of the cooling water does no fall within the predetermined range, the flow switch 132 permits stopping the plasma generation.

A lower electrode 114, which also serves to support the semiconductor wafer W, is disposed below the upper electrode 107 in a manner to face the upper electrode. An insulating elastic film 115 having a thickness of about 25 microns and formed of a polyimide series resin is attached to the upper surface of the lower electrode 114 with an acrylic adhesive interposed therebetween. The insulating elastic film 115 serves to keep constant the impedance between the semiconductor wafer W and the lower electrode 114. To be more specific, the impedance between the semiconductor wafer W and the lower electrode 114 is dependent on the distance between the two, with the result that the impedance noted above tends to become nonuniform. If the insulating elastic film 115 is interposed between the two, however, the impedance in question is made dependent on the elastic film 115 rather than on the distance between the semiconductor wafer W and the lower electrode 114. It follows that the presence of the insulating elastic film 115 permits stabilizing the impedance in question.

A clamp ring 118, which can be moved vertically by a driving mechanism 117 such as an air cylinder, is formed to surround the outer circumferential periphery of the lower electrode 114. If the peripheral portion of the semiconductor wafer W is pushed by the clamp ring 118 toward the elastic film 115, the semiconductor wafer W is held on the upper surface of the lower electrode 114 with a predetermined clamping load.

It should be noted that the upper surface of the lower electrode 114 is formed somewhat convex such that the upper surface of the lower electrode conforms with the semiconductor wafer W when the peripheral portion of the wafer W is pushed by the clamp ring 118. In other words, the curvature of the upper surface of the lower electrode 114 is made substantially equal to that of the semiconductor wafer W which has been deformed when the peripheral portion of the wafer W is pushed by the clamp ring 118.

The lower electrode 114 permits cooling the semiconductor wafer W supported thereon. For the cooling purpose, a cooling jacket 119 is disposed within the lower electrode 114. A coolant inlet pipe 120 and a coolant discharge pipe 121 are connected to the cooling jacket 119. Needless to say, a cooling medium, e.g., cooling water, is circulated within the cooling jacket 119 through the inlet pipe 120 and the discharge pipe 121 so as to cool the semiconductor wafer W disposed on the upper surface of the lower electrode 114.

Microscopic free spaces smaller than the surface roughness on the back surface of the semiconductor wafer W are unavoidably formed between the semiconductor wafer W and the elastic film 115 formed on the upper surface of the lower electrode 14. Thus, a gas inlet pipe 122 is formed through the central portion of the lower electrode 114 so as to supply a gas acting as a heat transfer medium between the elastic film 115 and the semiconductor wafer W into the microscopic free spaces noted above. The gas inlet pipe 122 is connected to a gas supply source 124 through a pressure control mechanism 123 disposed outside the reaction vessel 101.

The pressure control mechanism 123 connected to the gas inlet pipe 122 includes a main pipe 125 which is provided with a flow controller 126 serving to control the flow rate of the inlet gas, a main valve 127, and a pressure gauge 128. The flow controller 126 is positioned adjacent to the gas supply source 124. Also, a subsidiary pipe 129 is connected between the main valve 127 and the pressure gauge 128 of the main pipe 125. The subsidiary pipe 129 is connected to a vacuum pump 132 through a subsidiary valve 130 and a pressure control valve 131. Further, a controller 133 is connected to both the pressure gauge 128 and the pressure control valve 131. An automatic computer control is applied by the controller 133 to the pressure control valve 131 in accordance with a control program stored in advance on the basis of the pressure measured by the pressure gauge 128 within the microscopic free spaces formed between the elastic film 115 and the semiconductor wafer W. In the embodiment shown in FIG. 6, the main valve 127 is interlocked with the subsidiary valve 130.

An inert gas such as a nitroge gas, a helium gas or an argn gas is used as a heat transfer medium. In some cases, the reaction gas used for treating the semiconductor wafer can also be used as the heat transfer medium. In the present invention, the kind of the gas acting as a heat transfer medium is not particularly restricted in the present invention.

In the embodiment described above, the semiconductor wafer W is fixed by a mechanical clamping means. However, it is also possible to employ an electrostatic chuck for fixing the semiconductor wafer W as shown in FIG. 7.

Figure 7:
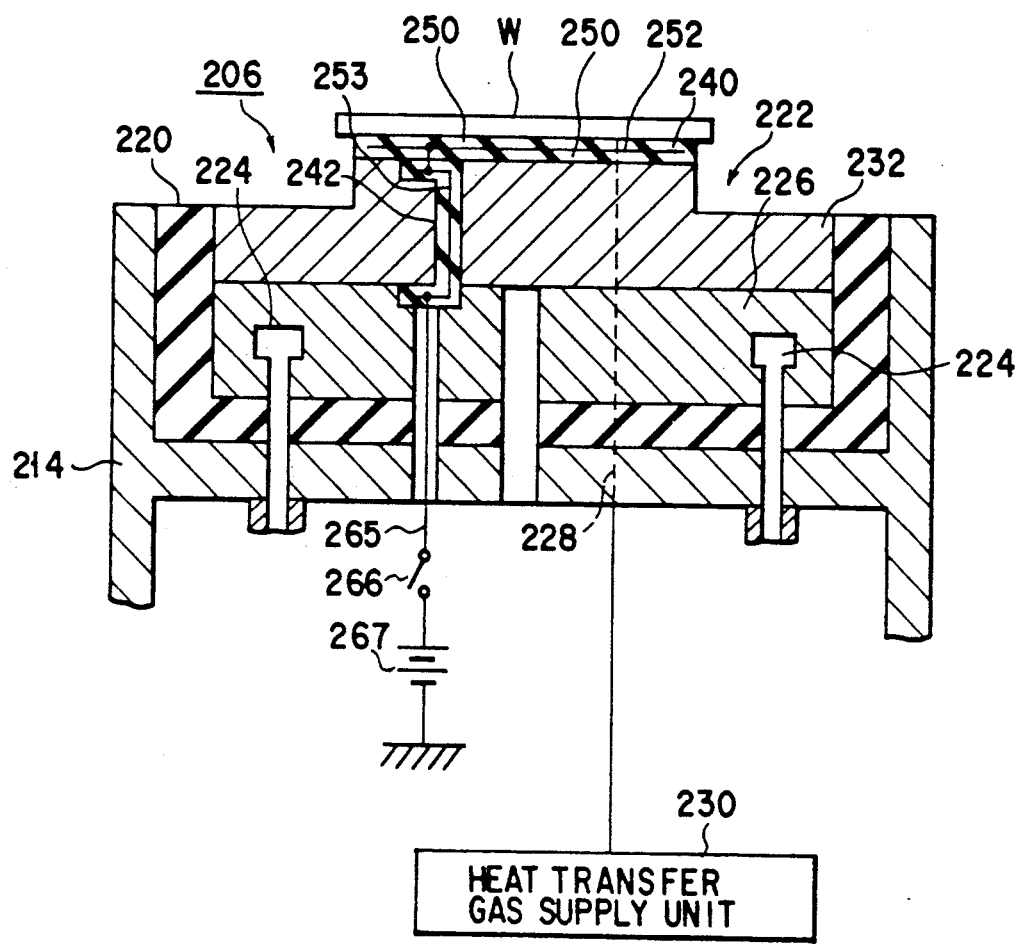
FIG. 7 is a cross sectional view showing an etching apparatus in which a semiconductor wafer is fixed to a lower electrode by utilizing an electrostatic chuck.

FIG. 7 shows the lower electrode portion alone. It is possible to employ the exactly the same construction as that shown in FIG. 6 with respect to the other portion of the apparatus.

As shown in FIG. 7, a table 206 is disposed on a lower structural member 214 with an insulating portion 220 interposed therebetween. Disposed on the table 206 are an electrostatic chuck 222 serving to fix the semiconductor wafer W and a temperature controlling section 226 serving to control the temperature of the semiconductor wafer W. A fluid passageway 224 for circulating cooling fluid is formed within the temperature control section 226. Further, a heat transfer gas supply hole 228 is formed in a manner to extend through the lower structural member 214, the insulating portion 220, and the table 206. A heat transfer gas such as a helium gas is supplied through the gas supply hole 228 into the clearance between the electrostatic chuck 222 and the semiconductor wafer W at a rate of 1 cc/sec with a pressure of, for example, 10 Torr so as to set the temperature difference between the semiconductor wafer W and the electrostatic chuck 222 at 10° C. or less. The proximal end portion of the gas supply holy 228 is connected to a heat transfer gas supply unit 230.

The electrostatic chuck 222 comprises a chuck body 232 constituting the lower electrode, an electrostatic suction sheet 240 which is flexible and is disposed to cover the upper surface of the chuck body 232, and a power supply sheet 242 serving to supply power to the electrostatic suction sheet 240. The chuck body 232 is formed of, for example, aluminum and is provided with a rectangular hole (not shown) extending throughout the entire thickness of the chuck body.

The electrostatic suction sheet 240 comprises two insulating polyimide sheets 250 and a conductive sheet 252 interposed between the two polyimide sheets 250 and is formed in a circular shape to conform with the surface shape of the chuck body 232. The peripheral portions of the two polyimide sheets 250 are fused to each other such that the fused portion covers the periphery of the conductive sheet 252. The conductive sheet 252 is formed of a conductor such as copper and has a thickness of about 20 microns. On the other hand, each of the polyimide sheets 250 has a thickness of about 50 microns.

The power supply sheet 242 is similar in construction to the electrostatic suction sheet 240. Specifically, the power supply sheet 242 comprises two polyimide sheets 250 and a conductive sheet 253 interposed between the two polyimide sheets 250. Incidentally, the power supply sheet 242 and the electrostatic suction sheet 240 need not be formed of the same material as far as these sheets 242 and 240 are equal to each other in the thermal expansion coefficient.

A contact terminal is formed at one end portion of the power supply sheet 242. Likewise, a contact terminal is formed on the back surface of the electrostatic suction sheet 240. These contact terminals are connected to each other so as to achieve an electrical connection between the power supply sheet 242 and the electrostatic suction sheet 240. Another contact terminal is formed at the other end portion of the power supply sheet 242, which is electrically connected to a lead wire 265. The lead wire 265 is connected to a DC power source 267 through an ON/OFF switch 266. It follows that, if the ON/OFF switch 266 is turned on, a DC voltage of, for example, 2 kV can be applied from the DC power source 267 to the electeostatic suction sheet 250 through the power supply sheet 242. Incidentally, a region in the vicinity of the contact terminal formed at the other end portion of the power supply sheet 242 is hermetically sealed by an O-ring (not shown).

In the electrostatic shuck 222, a high voltage (2 KV) is applied by the DC power source 267 between the semiconductor wafer W and the conductive sheet 252 of the electrostatic suction sheet 240 so as to generate positive and negative charges on the conductive sheet 252 and the semiconductor wafer W, respectively, with the result that the semiconductor wafer W is sucked and fixed to the electeostatic suction sheet 240 by the Coulomb force acting between the positive and negative charges noted above. Suction force F in this step is theoretically represented by a formula given below:

$$F = (\tfrac{1}{2}) S \epsilon \, (V/d)^2$$

where, S is the area of the conductive sheet 252, $\epsilon$ is the dielectric constant of the insulating film, V is the voltage, and d is the thickness of the insulating film.

The suction force F is 50 g/cm$^2$ in the case of using a polyimide sheet as an insulating film and 200 to 500 g/cm$^2$ in the case of using a ceramic sheet as an insulating film.

In the embodiment shown in FIG. 7, the power supply means for obtaining the suction force F comprises the electrostatic suction sheet 240 and the power supply sheet 242 covered with the chuck body 232. It follows that, where the electrostatic chuck is used as a chuck in a plasma etching apparatus, the power supply sheet 242 is not exposed to the plasma-forming space. As a result, a plasma damage is not done to the power supply sheet 242, making it possible to markedly prolong the life of the sheet.

It should also be noted that, in the embodiment shown in FIG. 7, the temperature of the semiconductor wafer W is controlled, e.g., cooled, by the temperature control section 226 during the plasma etching operation. In order to cool the semiconductor wafer W, it is absolutely necessary to load a gas effective for improving the heat conductivity in the space between the semiconductor wafer W and the electrostatic suction sheet 240 by using a device shown in, for example, FIG. 6. In other words, heat transfer may not be performed satisfactorily under the suction force F noted above. Under the circumstances, the suction force F also performs a sealing function for increasing the pressure of the heat transfer gas introduced into the space between the semiconductor wafer W and the electrostatic suction sheet 240.

In the embodiment described above, the insulating sheet included in each of the electrostatic suction sheet 240 and the power supply sheet 242 is formed of polyimide. However, material of the insulating sheet noted above need not be restricted to polyimide. For example, a ceramic may be used in place of the polyimide sheet. On the other hand, the conductive sheet included in each of these sheets 240 and 242 is formed of copper. However, the material of the conductive sheet noted above need not be restricted to copper. Incidentally, the materials of the electrostatic suction sheet 240 and the power supply sheet 242 can be selected appropriately, as desired, as far as these sheets 240 and 242 are substantially equal to each other in the thermal expansion coefficient. If the sheets 240 and 242 differ from each other in the thermal expansion coefficient, a detrimental effect is given to the electrical connection between the contact terminals of these sheets when these sheets are thermally deformed.

The electrostatic chuck described above can be used in a plasma etching apparatus. When a plasma is generated between the upper electrode and the lower electrode included in the plasma etching apparatus, a semiconductor wafer arranged between these upper and lower electrodes is rendered conductive to the upper electrode by the generated plasma, with the result that negative charges are stored in the semiconductor wafer. If follows that a Coulomb force between the electrostatic suction sheet in which positive charges are accumulated and the semiconductor wafer is increased so as to increase the suction force of the electrostatic chuck.

An experiment was conducted by using the apparatus shown in FIG. 6 in an attempt to see how the etching rate, the etching selectivity, the etched shape, etc. are affected by the change in temperature of the lower electrode. Specifically, a semiconductor wafer W having a diameter of 15 cm was prepared as a workpiece by forming a silicon dioxide film 200 Å thick on a silicon substrate, followed by forming a polysilicon film 4,000 Å thick on the silicon dioxide film and subsequently forming a resist film 10,000 Å thick on the polysilicon film. The semiconductor wafer W thus prepared was disposed on the upper surface of the lower electrode 114 having a diameter of 18 cm. Under this condition, the first gas of a HBr gas and the second gas of HCl gas were introduced into the reaction vessel 101 through the gas supply pipe 109 and the hole 110, respectively. These HBr gas and the HCl gas were supplied at the flow rates of 30 sccm and 200 sccm, respectively. Further, the inner space of the reaction vessel 101 was evacuated through the discharge pipe 113 so as to set the gas pressure within the reaction vessel at 500 mTorr.

Further, the clearance between the electrodes 107 and 114 was set at 8 mm, and the clamping pressure was set at 5 Kg/cm$^2$. Under this condition, a helium gas acting as a cooling medium was allowed to flow at a flow rate of 5 sccm through the gas inlet pipe 122 with a back pressure of 3 Torr. Then, a high frequency power of 200 W having a frequency of 13.56 MHz was applied between the electrodes 107 and 114 so as to generate plasma and, thus, to etch the polysilicon film of the semiconductor wafer W. During the etching operation, the temperature of the upper electrode 107 was set at 40° C., with the temperature of the lower electrode 114 being changed from 20° C. to 80° C. In accordance with the change in the temperature of the lower electrode, the surface temperature of the semiconductor wafer W was changed from about 60° C. to about 120° C. Incidentally, the surface temperature of the semiconductor wafer W was measured by using a thermolabel.

Figure 9A:
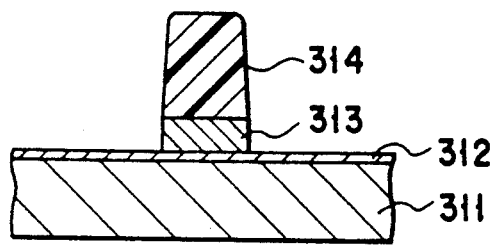
FIGS. 9A to 9D are cross sectional views each showing how the etched shape is affected by the temperature of the lower electrode.
Figure 9B:
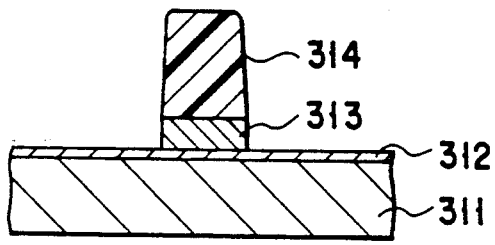
Figure 9C:
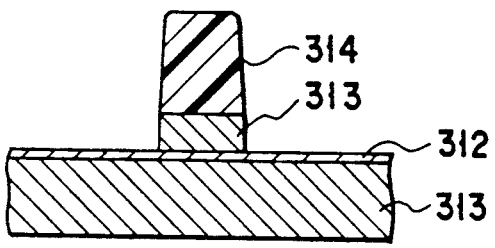

FIGS. 8 and 9A to 9D show the results of the experiment described above. FIG. 9A covers the case where the temperature of the lower electrode 114 was set at 20° C., FIG. 9B covers the case where the temperature of the lower electrode 114 was set at 40° C., FIG. 9C covers the case where the temperature of the lower electrode 114 was set at 60° C., and FIG. 9D covers the case where the temperature of the lower electrode 114 was set at 80° C. Throughout FIGS. 9A to 9D, reference numerals 311 and 312 denote the silicon substrate and silicon dioxide film, respectively. Also, reference numerals 313 and 314 denote the polysilicon film and the resist film, respectively.

Figure 9D:
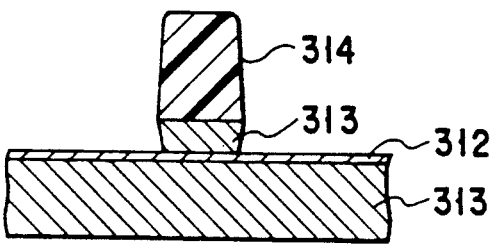

As apparent from FIGS. 8 and 9A to 9D, an increased etching rate of the polysilicon film was recognized in the case where the temperature of the lower electrode 114 was set at 80° C. However, a significant difference in the polysilicon etching rate was not recognized in the case where the temperature of the lower electrode was lower than 80° C. The etching rate of the silicon dioxide film was found to increase with increase in the temperature of the lower electrode 114. Also, the etching selectivity of the polysilicon film to the silicon dioxide film, i.e., a ratio of the polysilicon etching rate to the silicon dioxide etching rate, was found to markedly decrease with increase in the temperature of the lower electrode 114. Further, the etching selectivity of the polysilicon film to the resist film, i.e., a ratio of the polysilicon etching rate to the resist film etching rate, was found to slightly increase with increase in the temperature of the lower electrode 114. Still further, a large side etching was recognized, where the temperature of the lower electrode 114 was set at 80° C., as shown in FIG. 9D.

The experimental results shown in FIGS. 8 and 9A to 9D clearly indicate that the temperature of the lower electrode should fall within a range of between 20° and 60° C. Incidentally, if the temperature of the lower electrode is lower than 20° C., the etching rate of the polysilicon film is lowered, with the result that a long etching time is required. In addition, foreign matter tends to remain on the wafer surface.

Still additional experiment was conducted by using the apparatus as shown in FIG. 6 in an attempt to examine how the etching rate, the etching selectivity, and the etched shape are affected by the distance between the upper electrode and the lower electrode. Specifically, a semiconductor wafer W having a diameter of 15 cm was prepared as a workpiece by forming a silicon dioxide film 200 Å thick on a silicon substrate, followed by forming a polysilicon film 4,000 Å thick on the silicon dioxide film and subsequently forming a resist film 10,000 Å thick on the polysilicon film. The semiconductor wafer W thus prepared was disposed on the upper surface of the lower electrode 114 having a diameter of 18 cm. Under this condition, the first gas of a HBr gas and the second gas of HCl gas were introduced into the reaction vessel 101 through the gas supply pipe 109 and the hole 110, respectively. These HBr gas and the HCl gas were supplied at the flow rates of 30 sccm and 200 sccm, respectively. Further, the inner space of the reaction vessel 101 was evacuated through the discharge pipe 113 so as to set the gas pressure within the reaction vessel at 500 mTorr.

Figure 10:
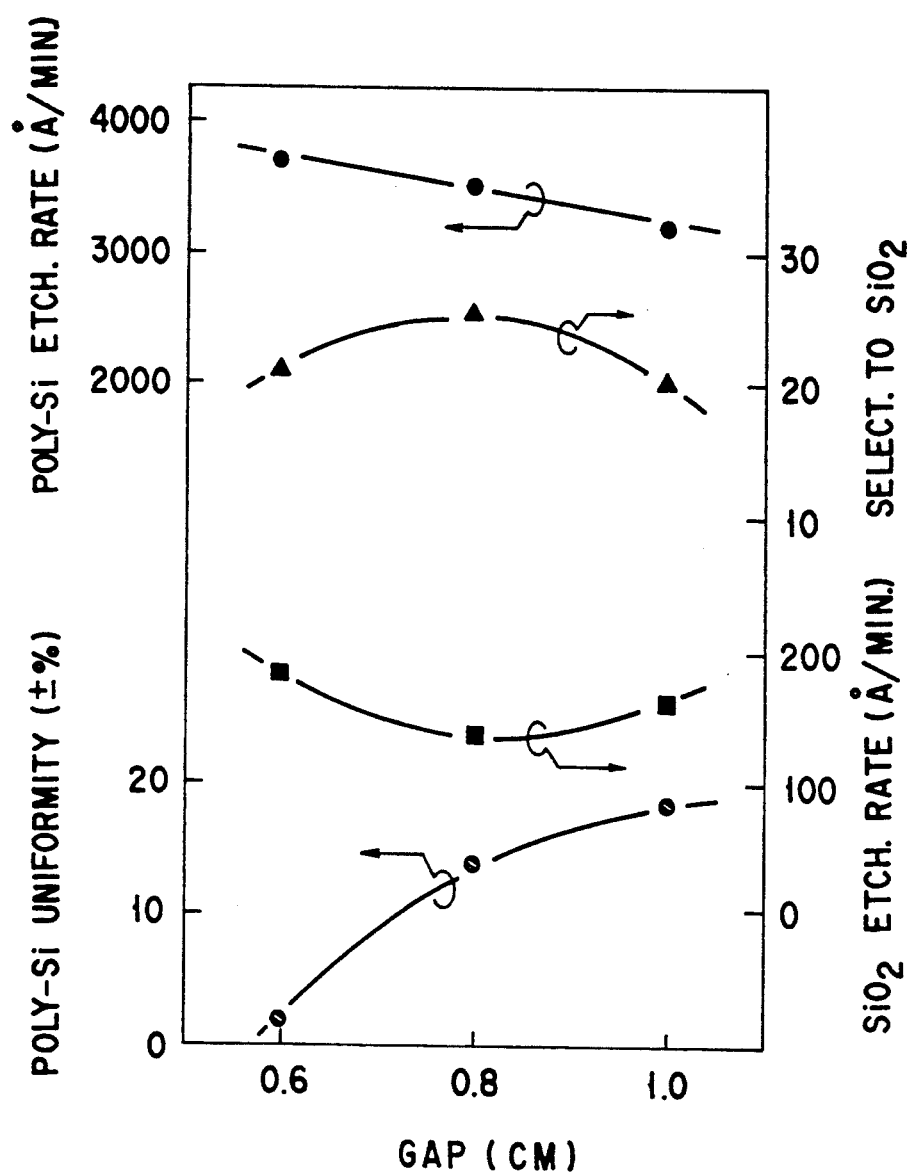
FIG. 10 is a graph showing the etching rate, the etching selectivity and the etched shape are affected by the gap between the lower electrode and the upper electrode.

Further, the clamping pressure was set at 5 Kg/cm$^2$ and a helium gas acting as a cooling medium was allowed to flow at a flow rate of 5 sccm through the gas inlet pipe 122 with a back pressure of 3 Torr. Then, a high frequency power of 200 W having a frequency of 13.56 MHz was applied between the electrodes 107 and 114 so as to generate plasma and, thus, to etch the polysilicon film of the semiconductor wafer W. During the etching operation, the temperature of the upper electrode 107 was set at 40° C., with the temperature of the lower electrode 114 being set at 60° C. Further, the clearance between the electrodes 107 and 114 was changed within a range of between 6 mm and 8 mm. FIG. 10 shows the results.

As seen from FIG. 10, the polysilicon etching rate was increased with increase in the distance between the lower electrode and the upper electrode. The silicon dioxide etching rate was slightly lowered when the distance between the upper electrode and the lower electrode was set at 8 mm. Further, the largest value of the polysilicon etching selectivity to the silicon dioxide film, i.e, a ratio of the polysilicon etching rate to the silicon dioxide etching rate, was exhibited when the distance between the upper electrode and the lower electrode was set at 8 mm. Still further, the uniformity of the polysilicon etching was lowered with increase in the distance between the upper electrode and the lower electrode.

The experimental results shown in FIG. 10 clearly support that the distance between the upper electrode and the lower electrode should fall within a range of between 6 mm and 8 mm.

As described above in detail, the present invention provides a dry etching method in which a mixed gas comprising a first gas containg Br and a second gas containing a halogen element, for example, HBr gas and HCl gas, other than Br is introduced into an etching reaction chamber. Under this condition, a high frequency power is applied to the upper electrode so as form plasma of the mixed gas between the upper electrode and the lower electrode disposed within the etching reaction chamber. The plasma is irradiated, as desired, with an ultraviolet light, and a workpiece, i.e., a polysilicon film formed on a semiconductor wafer, is etched. The etching treatment is carried out under optimum conditions. For example, the surface temperature of the workpiece, i.e., the semiconductor wafer, is maintained at a level falling within a range of between 70° C. and 120° C. Also, the clearance between the upper electrode and the lower electrode is set to fall within a range of between 6 mm and 8 mm. The high frequency power per unit area of the workpiece (or power density) is controlled to fall within a range of between 0.85 W/cm$^2$ and 1.41 W/cm$^2$. Further, the flow rate ratio of the mixed gas introduced into the etching reaction chamber is controlled appropriately. The particular method of the present invention makes it possible to achieve a satisfactory anisotropic etching with a high etching selectivity and a high etching rate. What should also be noted is that the method of the present invention permits suppressing the etching residue and also permits etching the workpiece at substantialy right angles relative to the surface of the workpiece. Naturally, the method of the present invention is highly effective for achieving the etching for preparation of fine patterns accompanying a high integration density of a semiconductor device.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A dry etching method, comprising the steps of:
    disposing a workpiece having an exposed polysilicon layer on the upper surface of a lower electrode disposed to face an upper electrode within an etching apparatus; and supplying a mixed gas comprising a first gas containing bromine and a second gas containing a halogen element other than bromine in a plasma discharge region over the workpiece, RF power being applied to the upper electrode so as to form a plasma of the mixed gas in said discharge region and to permit the exposed polysilicon layer of the workpiece to be etched with the plasma, said plasma discharge region being irradiated with ultraviolet light when said workpiece is etched.

2. The dry etching method according to claim 1, wherein the surface temperature of the workpiece is 70° C. and 120° during the etching treatment.

3. The dry etching method according to claim 1, wherein the workpiece is fixed to the upper surface of the lower electrode by a mechanical clamping means, and the temperature of the lower electrode is between 60° C. and 100° C.

4. The dry etching method according to claim 1, wherein the workpiece is fixed to the upper surface of the lower electrode by an electrostatic chuck means, and the temperature of the lower electrode is maintained at a level falling within a range of between 60° C. and 100° C.

5. The dry etching method according to claim 1, wherein the workpiece is in the form of a disk, the lower electrode is in the form of a disk having a diameter 1 to 1.47 times as large as that of the workpiece, and the clearance between the upper electrode and the lower electrode is maintained at 6 mm to 8 mm during the etching treatment.

6. The dry etching method according to claim 1, wherein the workpiece is in the form of a disk having a diameter of 150 mm, the lower electrode is in the form of a disk having a diameter of 150 to 220 mm, and the clearance between the upper electrode and the lower electrode is maintained at 6 mm to 8 mm during the etching treatment.

7. The dry etching method according to claim 1, wherein the first gas consists of a HBr gas and the second gas consists of a HCl gas or a $Cl_2$ gas.

8. The dry etching method according to claim 7, wherein the flow rate ratio (HBr)/(HBr+(Hcl or $Cl_2$)) falls within a range of between 5 and 50%.

9. The dry etching method according to claim 1, wherein a high frequency power per unit area of the workpiece of 0.85 to 1.41 $W/cm^2$ at a frequency of 13.56 MHz is applied between the upper electrode and the lower electrode.

10. The dry etching method according to claim 2, wherein a cooling gas is circulated through a clearance between the workpiece and the lower electrode for keeping the surface temperature of the workpiece to fall within a range of between 70° C. and 120° C.

* * * * *